(12) United States Patent
Heim et al.

(10) Patent No.: US 9,030,840 B2
(45) Date of Patent: May 12, 2015

(54) ARRANGEMENT COMPRISING AN ELECTRIC AND/OR ELECTRONIC MODULE AND A CIRCUIT CARRIER

(75) Inventors: Michael Heim, Holzgerlingen (DE); Sigmund Braun, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 270 days.

(21) Appl. No.: 13/635,606

(22) PCT Filed: Mar. 16, 2011

(86) PCT No.: PCT/EP2011/053976
§ 371 (c)(1),
(2), (4) Date: Nov. 27, 2012

(87) PCT Pub. No.: WO2011/113863
PCT Pub. Date: Sep. 22, 2011

(65) Prior Publication Data
US 2013/0063903 A1    Mar. 14, 2013

(30) Foreign Application Priority Data
Mar. 17, 2010   (DE) .......................... 10 2010 002 943

(51) Int. Cl.
H05K 7/06 (2006.01)
H05K 3/32 (2006.01)
H05K 1/18 (2006.01)

(52) U.S. Cl.
CPC ......... *H05K 3/325* (2013.01); *H05K 1/18* (2013.01); *H05K 3/326* (2013.01); *H05K 2201/0397* (2013.01); *H05K 2201/0969* (2013.01); *H05K 2201/1009* (2013.01); *H05K 2201/10401* (2013.01); *H05K 2201/10568* (2013.01); *H05K2201/1059* (2013.01); *H05K 2201/1081* (2013.01); *H05K 2201/10863* (2013.01)

(58) Field of Classification Search
CPC ........... H05K 3/32; H05K 7/06; H05K 3/308; H05K 7/1007; H05K 3/325
USPC .................................................. 361/728, 801
See application file for complete search history.

(56) References Cited

U.S. PATENT DOCUMENTS

| | | |
|---|---|---|
| 2,973,499 A | 2/1961 | Hammell |
| 3,093,887 A | 6/1963 | Prestige et al. |
| 3,487,350 A | 12/1969 | Hammell |

(Continued)

FOREIGN PATENT DOCUMENTS

| | | |
|---|---|---|
| DE | 1232227 | 1/1967 |
| DE | 2841443 | 4/1980 |

(Continued)

OTHER PUBLICATIONS

International Search Report for Application No. PCT/EP2011/053976 dated Jun. 20, 2011 (English Translation and Original, 4 pages).

*Primary Examiner* — Dion R Ferguson
*Assistant Examiner* — Mandeep Buttar
(74) *Attorney, Agent, or Firm* — Michael Best & Friedrich LLP

(57) ABSTRACT

The invention relates to an arrangement comprising an electric and/or electronic module (10) and a circuit carrier (12), wherein at least one electric connecting line (14) of the electric and/or electronic module (10) can be accommodated in a recess (16) of the circuit carrier (12). The arrangement comprises at least one clamping element (18a, 18b, 18c, 18d) which immobilizes the at least one connecting line (14) in the recess (16) once it has been introduced into the recess (16).

6 Claims, 8 Drawing Sheets

(56) References Cited

U.S. PATENT DOCUMENTS

| | | | |
|---|---|---|---|
| 4,037,899 A | | 7/1977 | Crowell |
| 4,421,368 A | * | 12/1983 | Saban ............................. 439/83 |
| 4,657,327 A | * | 4/1987 | Weingartner ................. 439/289 |
| 5,928,005 A | | 7/1999 | Li et al. |
| 6,323,440 B1 | | 11/2001 | Maruyama et al. |

FOREIGN PATENT DOCUMENTS

| | | |
|---|---|---|
| DE | 9305285 | 6/1993 |
| DE | 19735409 | 3/1999 |
| DE | 10344264 | 4/2005 |
| DE | 102007041904 | 3/2009 |
| FR | 2717340 | 9/1995 |
| JP | 52052029 | 4/1977 |
| JP | 54115223 | 9/1979 |
| JP | 58178975 | 10/1983 |
| JP | 4096392 | 3/1992 |
| JP | 5-6710 | 1/1993 |
| JP | 2004047826 | 2/2004 |
| WO | 01/45212 | 6/2001 |

* cited by examiner

ARRANGEMENT COMPRISING AN ELECTRIC AND/OR ELECTRONIC MODULE AND A CIRCUIT CARRIER

BACKGROUND OF THE INVENTION

The invention is based on an arrangement comprising an electric and/or electronic module and a circuit carrier.

In order for connecting lines or connecting wires to make electrical contact with a circuit carrier, use is customarily made of soldering methods or the "pressing-in technique" during installation of electric and/or electronic modules. In the case of the soldering method, a soldering paste deposit is customarily applied to the circuit carrier by different methods, for example screen printing or dispensing, and the connecting wire is subsequently soldered, for example, by a reflow soldering method or a selective soldering method. For this purpose, the corresponding connecting wires generally have to have a solderable surface, i.e. have to be appropriately coated. If contact is intended to be as early as in the partially assembled state of the electric and/or electronic module, the contacting points have to be accessible for the soldering method to be applied. This results in restrictions with regard to the structural configuration of the electric and/or electronic module and of the process flow. In the "pressing-in technique", a specially shaped, flexible "pressing-in zone" is provided on the connecting wire and pressed into a sleeve arranged in the printed circuit board. However, said pressing-in technique imposes certain demands with regard to the tolerances, in particular in respect of the pressing-in depth during installation.

For example, laid-open application DE 10 2007 041 904 A1 describes an arrangement comprising an electric and/or electronic module and a circuit carrier, in which at least one electric connecting line of the electric and/or electronic module can be accommodated in the form of what is referred to as a push-through contact in a recess of the circuit carrier. The connecting wire of the module is subsequently soldered in the recess of the circuit carrier, for example by a reflow soldering method.

SUMMARY OF THE INVENTION

By contrast, the arrangement according to the invention comprising an electric and/or electronic module and a circuit carrier has the advantage of at least one clamping device being provided, the clamping device fixing the at least one connecting line in the recess after the latter is introduced into the recess.

Embodiments of the present invention make it possible for the electric and/or electronic module to be securely and directly in contact with the circuit carrier in a simple and cost-effective manner. This means that a direct plug-in contact of the connecting line, which is preferably in the form of a wire, of the electric and/or electronic module to the circuit carrier is made possible. When the two components are installed or joined, the at least one electric connecting line of the electric and/or electronic module is introduced into the recess of the circuit carrier and, upon being introduced, is fixed in the recess by the clamping device. In an advantageous manner, this does not impose any demands regarding the accessibility of the contact point, thus permitting what is referred to as concealed joining of the two components and thereby simplified overall installation of the arrangement. A substantial advantage of the present invention resides in the fact that the connecting lines which are present on the electric and/or electronic modules and are in the form of winding wires or of phase connections can be directly connected to the circuit carrier without intermediate contacting elements, for example "circuit boards", irrespective of the number of wires. Therefore, all of the necessary components can advantageously be directly installed on the circuit carrier, thus enabling good heat extraction without tolerance problems. The arrangement furthermore also permits greater tolerances, in particular in the introduction depth or the press-in depth of the connecting line, i.e. during the installation of the two components. In addition, the connecting lines do not require a special surface, and therefore increased material costs and complicated machining steps can be dispensed with. The invention can advantageously be used for all connections where electrical contact has to be made with connecting lines or wires.

In a refinement of the arrangement according to the invention, the at least one electric connecting line is of substantially flexurally rigid design. The at least one electric connecting line is preferably surrounded by a holding element in a reinforcing manner for this purpose. This advantageously results in increased dimensional stability of the connecting line, which considerably simplifies the installation of the electric and/or electronic module on the circuit carrier. The two components can therefore be joined blind, since the connecting line cannot twist or buckle and therefore cannot be located at an unexpected point. In particular, this ensures a secure contact connection between the two components irrespective of the number of connecting lines or wires. The overall result is simple and secure installation of the electric and/or electronic module on the circuit carrier with little effort.

In a further refinement of the arrangement according to the invention, the at least one clamping device has at least one resiliently deformable tongue which deforms resiliently in the introduction direction when the connecting line is introduced into the recess. In an advantageous manner, the resiliently deformable tongue of the clamping device is particularly suitable for fixing the connecting line of the electric and/or electronic module in the recess of the circuit carrier because of the low forces of the tongue when the electric connecting line is introduced into the clamping device and the high tongue holding forces or clamping forces acting on the introduced electric connecting line.

In a further refinement of the arrangement according to the invention, the at least one clamping device comprises a locking disk element having a passage opening provided with resiliently deformable tongues, said locking disk element bearing against the circuit carrier in a manner covering the recess. The locking disk element can be produced by a simple punching process, wherein a trefoil-like structure is punched out of a circular disk such that a plurality of tongues are left. This therefore involves a mass produced component which can be produced cost-effectively and can be fastened on the circuit carrier in a simple manner. When the connecting line is pressed into the locking disk element, the tongues are deformed and a form-fitting connection between the locking disk element and the connecting line advantageously occurs. Given an adequately selected length of the connecting line, this type of contact connection is insensitive to tolerances. This advantageously does not impose any demands regarding the accessibility of the contact point, and therefore what is referred to as concealed joining of the two components and therefore saving on installation costs are possible.

In a further refinement of the arrangement according to the invention, the at least one clamping device comprises a contour which is arranged in the circuit carrier and forms at least one resiliently deformable tongue. Said contour which saves on construction space since it can be integrated into the circuit carrier can be produced in a particularly cost-effective manner and advantageously meets the demands by the connecting line being able to be placed directly in a simple manner into the contour integrated in the circuit carrier and fixed there. This installation is insensitive to tolerances, in particular with regard to the pressing-in depth.

In a further refinement of the arrangement according to the invention, the at least one clamping device comprises at least one ribbing which is plastically deformed when the connecting line is introduced into the recess. In this connection, the clamping device may comprise, for example, a sleeve which is arranged in the recess and at least part of the inner surface of which has a ribbing. A substantial advantage of the present invention consists in that the electric connecting line does not require a special surface, and a secure form-fitting connection of the electric connecting line to the clamping device is produced during joining. The electric and/or electronic module makes contact with the circuit carrier by pressing of the connecting line into the ribbed sleeve. In the process, the ribbing of the sleeve is plastically deformed and a form-fitting connection between the ribbed sleeve and the connecting wire occurs. Given an adequately selected wire length, this type of contact connection is likewise insensitive to tolerances. This advantageously does not impose any demands regarding the accessibility of the contact point, and therefore, in this embodiment too, what is referred to as concealed joining of the two components and therefore saving on installation costs are possible. The configuration according to the invention of the clamping device obviates the need for cost- and time-intensive working steps, for example soldering.

Furthermore, the clamping device may comprise, for example, a ribbing which at least partially surrounds the at least one electric connecting line. The connecting line can then be pressed directly into a sleeve arranged in the circuit carrier. In an advantageous manner, when the electric connecting line is introduced into the clamping device, a secure form-fitting connection is produced by the plastic deformation of the ribbing. Given a suitably selected length of the connecting line or suitably selected length of the ribbing on the connecting line, said contacting method is insensitive to tolerances, and therefore no particular demands are imposed on the accessibility of the contact point here either and concealed joining of the two components while saving on installation costs is possible. In addition, this contacting method is very economical, since all customary known finishing work can be dispensed with.

In a further refinement of the arrangement according to the invention, at least one centering device is provided with a centering body on the connecting line side and a centering body which is on the circuit carrier side and interacts with the centering body on the connecting line side. By this means, rapid and secure installation or rapid and secure joining of the electric and/or electronic module and the circuit carrier is advantageously possible, since the connecting line is automatically centered via the centering device during installation or joining. This advantageously ensures secure introduction of the connecting line into the recess and therefore secure contact connection of the module with the circuit carrier.

Preferably, a plurality of centering bodies are combined to form a constructional unit. The configuration according to the invention permits cost-effective production of the centering bodies and simplified installation of the centering bodies on the arrangement, since, in this case, individual centering bodies no longer have to be produced and fitted.

BRIEF DESCRIPTION OF THE DRAWINGS

Exemplary embodiments of the invention are illustrated in the drawings and are explained in more detail in the description below.

DETAILED DESCRIPTION

Figure 1:
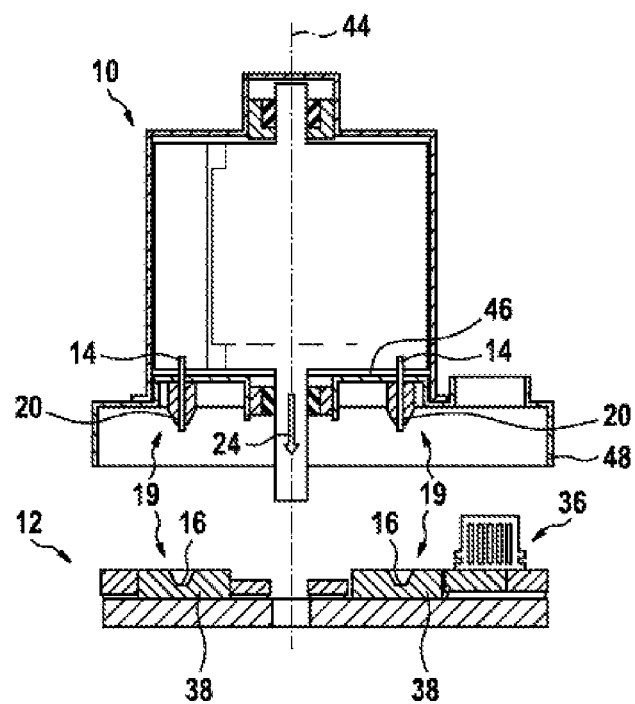
FIG. 1 shows a schematic sectional illustration of an exemplary embodiment of an arrangement according to the invention comprising an electric and/or electronic module with connecting lines and a circuit carrier with recesses for receiving the connecting lines, in an unfitted state.
Figure 2:
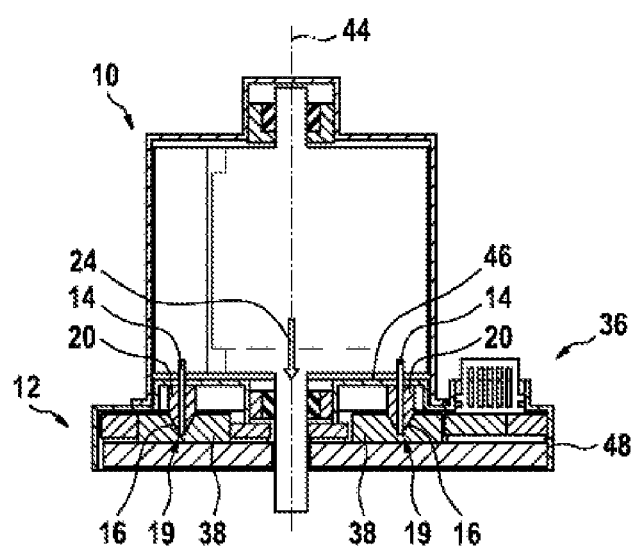
FIG. 2 shows a schematic sectional illustration of the arrangement from FIG. 1 in a fitted state.
Figure 3:
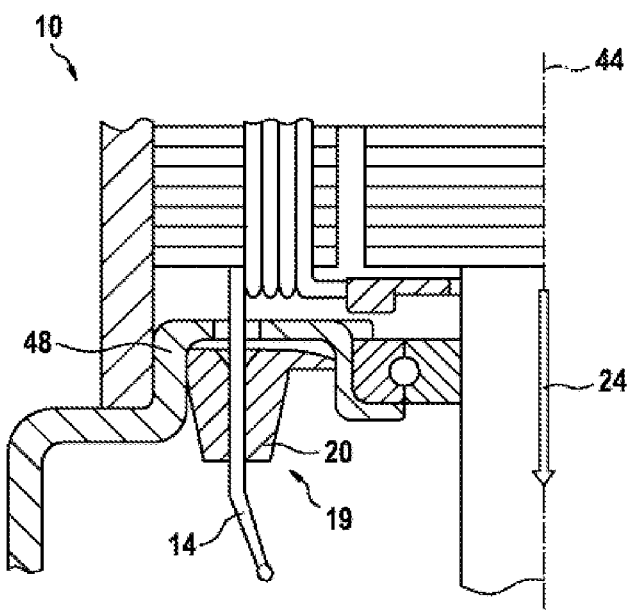
FIG. 3 shows a schematic sectional illustration of a connecting line of the electric and/or electronic module, which connecting line is surrounded in a reinforcing manner by a holding element in the form of a centering body.

As is apparent from FIGS. 1 and 2, an arrangement according to the invention comprises an electric and/or electronic module 10 and a circuit carrier 12, in which arrangement at least one electric connecting line 14 of the electric and/or electronic module 10 can be accommodated in a recess 16 of the circuit carrier 12. In the present exemplary embodiments, the electric and/or electronic module 10 is an electric motor and the electric connecting line 14 is a winding wire of the electric motor. The circuit carrier 12 preferably comprises a printed circuit board and/or a substrate. The substrate is preferably designed as a plastics substrate or as a ceramic substrate. In the present exemplary embodiments, the circuit carrier 12 is preferably designed in the manner of a board and is preferably of rectangular design in outline.

The electric and/or electronic module 10 advantageously comprises a housing element 48 which protrudes over a base region 46 of the electric and/or electronic module 10, is fastened to the electric and/or electronic module 10 and is intended for receiving the circuit carrier 12.

As is apparent from FIGS. 1, 2, 10 and 11, at least one electric and/or electronic circuit unit 36 is mounted on the circuit carrier 12. The circuit carrier 12 also has two recesses 16 for the electrical connection of the electric and/or electronic module 10 or for receiving the electric connecting lines 14 of the electric and/or electronic module 10. In the present exemplary embodiments, the recesses 16 are designed as continuous push-through openings.

In order to enable the at least one connecting line 14 of the electric and/or electronic module 10 to make direct and secure contact with the circuit carrier 12 without additional contacting elements and also to enable concealed joining of the two components 10, 12, the arrangement comprises, according to the invention, at least one clamping device 18a, 18b, 18c and 18d which fixes the at least one connecting line 14 in the recess 16 after the latter is introduced into the recess 16.

In order to enable blind joining or fitting of the electric and/or electronic module 10 and of the circuit carrier 12 by preventing twisting or buckling of the connecting lines 14 of the module 10 during the joining or installation operation, the at least one electric connecting line 14 is of substantially flexurally rigid design in the contacting region. For this purpose, the at least one electric connecting line 14 is surrounded in a reinforcing manner by a holding element 20 which is illustrated in FIGS. 1 to 4. The holding element 20 serves to axially guide the connecting line 14 and is preferably designed in the form of a plastic part. In the present exemplary embodiment, the holding element 20 is fastened to the housing element 48 of the electric and/or electronic module 10, said housing element serving to receive the circuit carrier 12.

The holding element 20 is preferably pressed onto the connecting line 14. By this means, the free end of the electric connecting line 14 is advantageously reinforced particularly well by the holding element 20 and is therefore guided axially such that the electric connecting line 14 obtains support with regard to the dimensional stability and is thereby secured against bending or buckling during the installation of the two components 10, 12. During the installation, the retaining element 20 is first of all pushed over the connecting line 14 or the connecting wire. The insulation is then stripped from the connecting wire 14. The end of the connecting wire 14 is subsequently shaped by said end being subjected to a stamping operation in order to axially secure the holding element 20 and in order to form an introduction tip. The connecting wire 14 is finally cut to length.

According to a first operative principle illustrated in FIGS. 4 to 11, the at least one clamping device 18a, 18b comprises at least one resiliently deformable tongue 22a, 22b which is twisted in the introduction direction 24 when the connecting line 14 is introduced into the recess 16.

Figure 4:
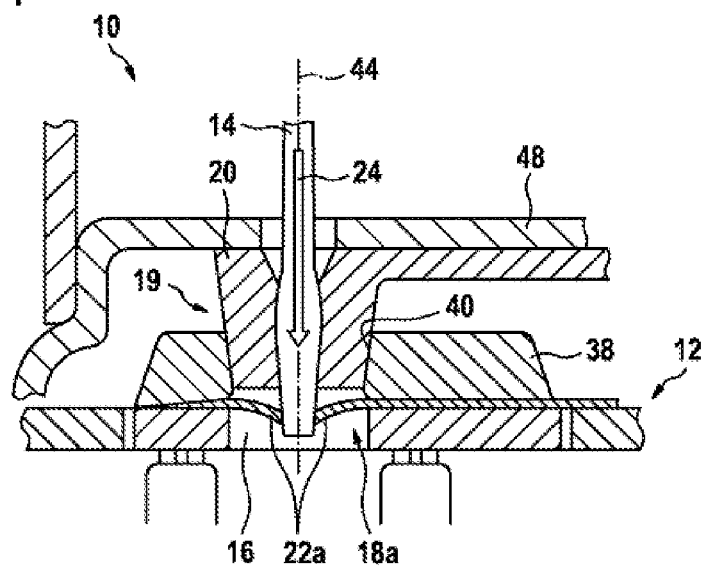
FIG. 4 shows a schematic sectional illustration of a connecting line fixed in a recess of the circuit carrier by a first exemplary embodiment of a clamping device, wherein the clamping device is designed as a locking disk and a centering body is arranged over the clamping device.
Figure 5:
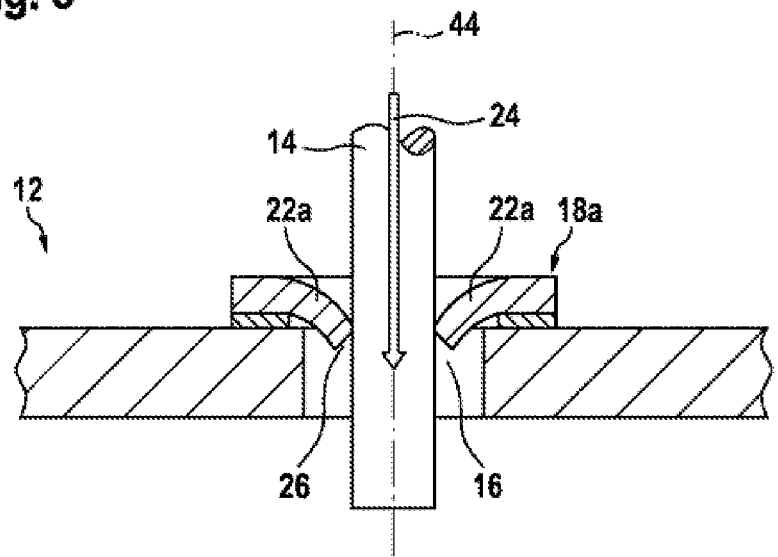
FIG. 5 shows a schematic sectional illustration of the clamping device from FIG. 4, which is designed as a locking disk and fixes a connecting line of the electric and/or electronic module in a recess of the circuit carrier.
Figure 6:
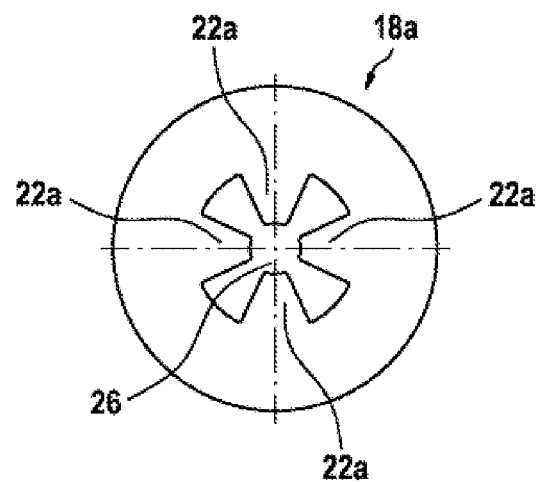
FIG. 6 shows a schematic top view of the clamping device from FIGS. 4 and 5, designed as a locking disk.

In a first embodiment or first variant embodiment of the first operative principle according to FIGS. 4 to 6, the at least one clamping device comprises a locking disk element 18a having a passage opening 26 provided with a plurality of resiliently deformable tongues 22a, said locking disk element bearing against the circuit carrier 12 in a manner covering the recess 16. The locking disk element 18a can be produced by a simple punching process, wherein a trefoil-like structure is punched out of a circular disk, thus leaving behind a plurality of resiliently deformable tongues 22a. The locking disk element 18a is soldered onto the circuit carrier 12 in such a manner that the center of the locking disk element 18a or the passage opening 26 in the locking disk element 18a lies over the recess 16 of the circuit carrier 12. The connecting line 14 can then be pressed in through said center or said passage opening 26 in the locking disk element 18a. In the process, the tongues 22a of the locking disk element 18a are deformed and a form-fitting connection between the locking disk element 18a and the connecting line 14 or the connecting wire occurs.

Figure 10:
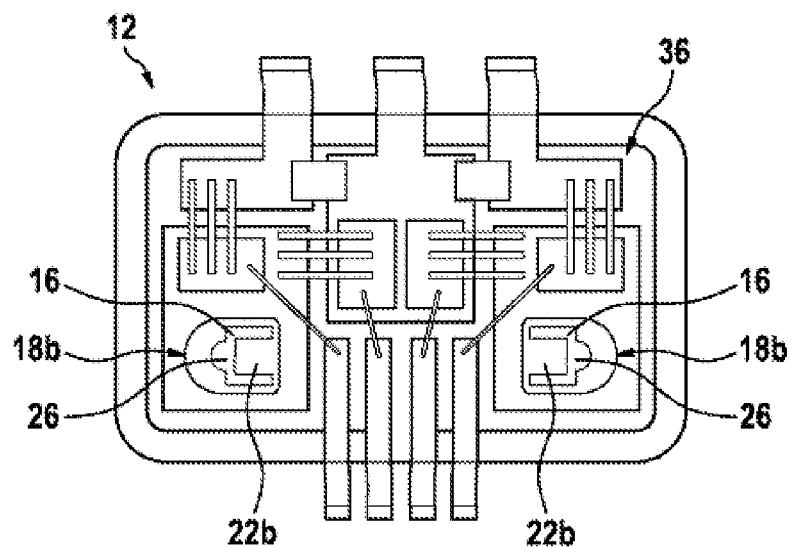
FIG. 10 shows a schematic top view of a circuit carrier with an electric and/or electronic circuit unit and a second exemplary embodiment of clamping devices for the connecting lines of the electric and/or electronic module.
Figure 11:
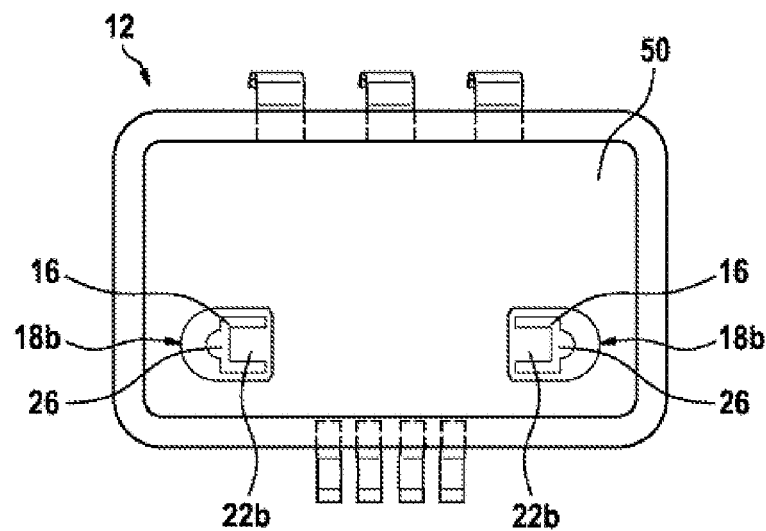
FIG. 11 shows a schematic top view of a circuit carrier, which is surrounded by a protective compound, with the second exemplary embodiment of the clamping devices from FIG. 10, wherein the protective compound surrounds the circuit carrier leaving the region of the clamping devices free.

In a second embodiment or second variant embodiment of the first operative principle according to FIGS. 10 to 11, the at least one clamping device comprises a contour 18b which is arranged in the circuit carrier 12 and forms at least one resiliently deformable tongue 22b. In this case, the connecting lines 14 or connecting wires may be pushed or introduced directly into the integrated contours 18b of the circuit carrier 12. The at least one contour 18b is preferably formed in a leadframe, which is preferably insert molded by plastic, in the circuit carrier 12.

FIG. 11 shows a circuit carrier 12, which is surrounded by a protective compound 50, with clamping devices 18b in the second embodiment, wherein the protective compound 50 surrounds the circuit carrier 12 leaving the region of the clamping devices 18b free.

In an advantageous manner, the arrangement according to FIGS. 1, 2, 4, 7 and 8 has at least one centering device 19 with a centering body 20 on the connecting line side and with a centering body 38 which is on the circuit carrier side and interacts with the centering body 20 on the connecting line side. In the present exemplary embodiments, the holding element 20, which is provided as a reinforcing element for the connecting line 14, is designed at the same time as part of the centering device 19 according to the invention or as the centering body 20, which is on the connecting line side, of the centering device 19. The centering body 38 which is on the circuit carrier side and is provided with a through opening 40 is arranged in a region of the clamping device 18a, 18b, 18c, 18d in such a manner that the through opening 40 thereof is aligned with the recess 16 of the circuit carrier 12. When the two components 10, 12 are installed, the centering body 20 on the connecting line side is at least partially accommodated in the centering body 38 on the circuit carrier side.

Figure 7:
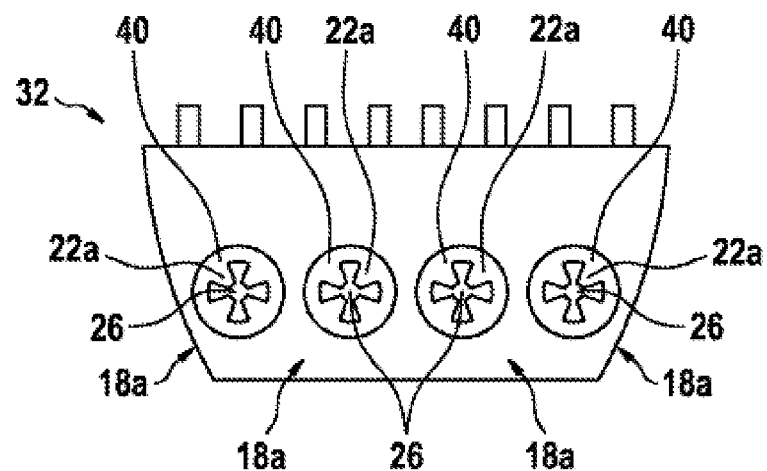
FIG. 7 shows a schematic top view of a plurality of centering bodies which are each arranged above a clamping device designed as a locking disk and are combined to form a four-cornered constructional unit.
Figure 8:
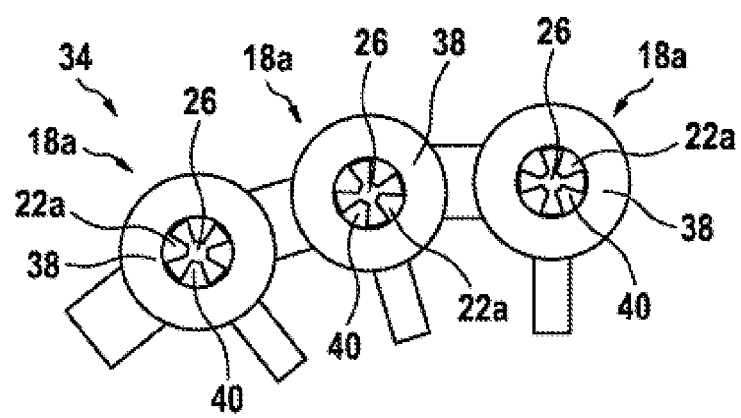
FIG. 8 shows a schematic top view of a plurality of centering bodies which are each arranged above a clamping device designed as a locking disk and are combined to form a curved constructional unit.
Figure 9:
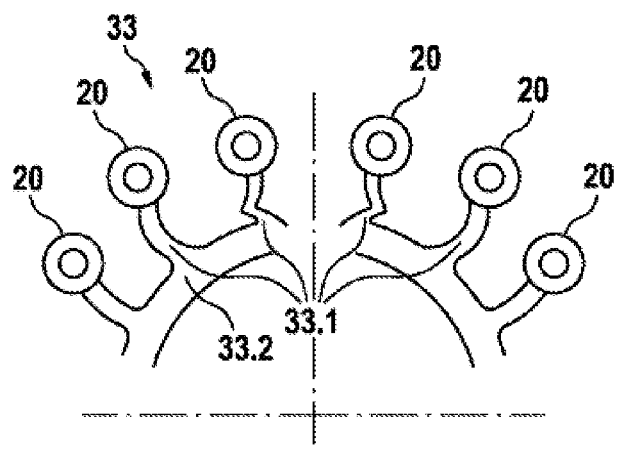
FIG. 9 shows a schematic top view of a plurality of holding elements which each surround a connecting line and are combined to form a curved constructional unit.

As is apparent from FIGS. 7 to 9, a plurality of centering bodies 20, 38 can be combined to form a constructional unit 32, 33, 34. FIG. 7 thus shows a plurality of centering bodies which are on the circuit carrier side, are arranged in a row and are combined to form a four-cornered constructional unit 32. FIG. 8 shows a plurality of centering bodies 38 which are on the circuit carrier side, are arranged in the manner of a circular arc and are combined to form a curved constructional unit 34, wherein an annular constructional unit would also be conceivable. FIG. 9 shows a plurality of centering bodies 20 which are on the connecting line side, are arranged in a curved manner and are combined to form a curved constructional unit 33, wherein an annular constructional unit would also be conceivable. The individual centering bodies 20 are connected to one another here via meandering structures 33.1 and to an arc 33.2 or ring of the constructional unit 33.

According to a second operative principle illustrated in FIGS. 12 to 17, the at least one clamping device 18c, 18d comprises at least one ribbing 28c, 28d which is plastically deformed when the connecting line 14 is introduced into the recess 16.

Figure 12:
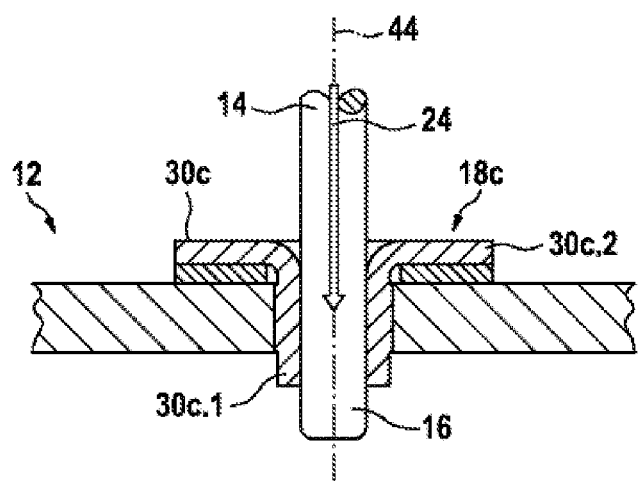
FIG. 12 shows a schematic sectional illustration of a third exemplary embodiment of a clamping device via which a connecting line is fixed in a recess of the circuit carrier.
Figure 13:
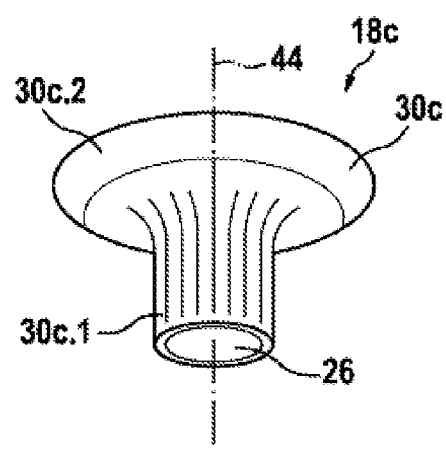
FIG. 13 shows a schematic perspective illustration of the clamping device from FIG. 12, which is designed as a sleeve with a collar.
Figure 14:
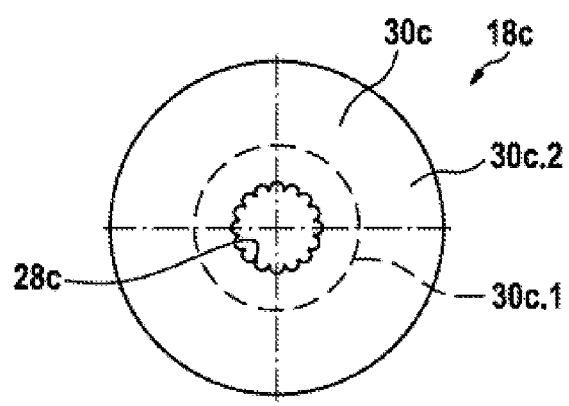
FIG. 14 shows a schematic top view of the clamping device from FIGS. 12 and 13, which is designed as a sleeve with a collar and the inner surface of which has ribbing.

In a third embodiment or a first variant embodiment of the second operative principle according to FIGS. 12 to 14, the at least one clamping device 18c comprises a sleeve 30c which is arranged in the recess 16 and at least part of the inner surface of which has a ribbing 28c. The sleeve 30c can be produced by punching, deep drawing and stamping. The inside diameter thereof is slightly smaller than the outside diameter of the connecting line 14 to be contacted. The orientation of the ribbing 28c which is stamped on is preferably parallel to a longitudinal axis 44 of the sleeve 30c. The sleeve 30c preferably has a sleeve-shaped part 30c.1 which is provided with the ribbing 28c and is adjoined by a collar 30c.2. The ribbed sleeve 30c is placed by the sleeve-shaped part 30c.1 thereof into the recess 16 and soldered via the collar 30c.2 thereof onto the circuit carrier 12. The connecting line 14 is pressed into the sleeve 30c. In the process, the ribbing 28c of the sleeve 30c is plastically deformed, and a form-fitting connection between the ribbed sleeve 30c and the connecting line 14 occurs.

Figure 15:
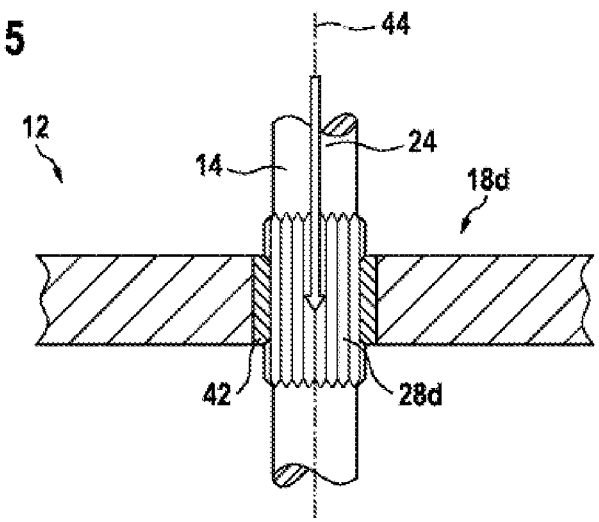
FIG. 15 shows a schematic sectional illustration of a fourth exemplary embodiment of a clamping device via which a connecting line is fixed in a recess of the circuit carrier.
Figure 16:
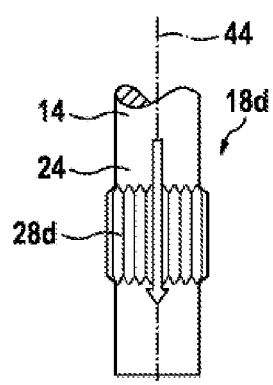
FIG. 16 shows a side view of the clamping device from FIG. 15, which is designed as ribbing at least partially surrounding an electric connecting line.
Figure 17:
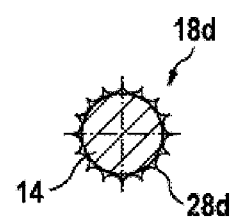
FIG. 17 shows a top view of the clamping device from FIGS. 15 and 16.

In a fourth embodiment or second variant embodiment of the second operative principle according to FIGS. 15 to 17, the at least one clamping device 18d comprises a ribbing 28d which at least partially surrounds the at least one electric connecting line 14. For this purpose, the connecting line or the connecting wire 14 is correspondingly machined, preferably stamped, and provided with a ribbing 28d. The connecting line 14 which is provided with the ribbing 28d can then be pressed directly into a plug-in sleeve 42 placed in the circuit carrier 12, or pressed directly into the circuit carrier 12. The plastic deformation of the ribbing 28d also leads here to a form-fitting connection.

During the installation or the joining of the two components 10, 12, the at least one electric connecting line 14 of the electric and/or electronic module 10 is introduced into the recess 16 of the circuit carrier 12 and, after being introduced, is fixed in the recess 16 by the clamping device 18a, 18b, 18c, 18d. All of the electric connecting lines 14 of the electric and/or electronic module 10 are advantageously introduced into one recess 16 each of the circuit carrier 12 in one working step and, upon being introduced, are fixed in the recess 16 by the clamping device 18a, 18b, 18c, 18d according to the invention.

The invention claimed is:

1. An arrangement comprising an electric and/or electronic module (10) and a circuit carrier (12), in which at least one electric connecting line (14) of the module (10) can be accommodated in a recess (16) of the circuit carrier (12), characterized by at least one clamping device (18a, 18b, 18c, 18d) which fixes the at least one connecting line (14) in the recess (16) after being introduced into the recess (16), and further characterized in that the at least one clamping device (18c, 18d) comprises at least one ribbing (28c, 28d) which is plastically deformed when the connecting line (14) is introduced into the recess (16).

2. The arrangement as claimed in claim 1, characterized in that the at least one electric connecting line (14) is of substantially flexurally rigid design.

3. The arrangement as claimed in claim 1, characterized in that the at least one clamping device (18c) comprises a sleeve (30c) which is arranged in the recess (16) and at least part of an inner surface of which has a ribbing (28c).

4. The arrangement as claimed in claim 1, characterized in that the at least one clamping device (18d) comprises a ribbing (28d) which at least partially surrounds the at least one electric connecting line (14).

5. The arrangement as claimed in claim 1, characterized by at least one centering device (19) with a centering body (20) on an connecting line side and a centering body (38) which is on an circuit carrier side and interacts with the centering body (20) on the connecting line side.

6. The arrangement as claimed in claim 1, characterized in that a plurality of centering bodies (20, 38) are combined to form a constructional unit (32, 33, 34).

\* \* \* \* \*